United States Patent
Leung et al.

(10) Patent No.: US 11,115,094 B1
(45) Date of Patent: Sep. 7, 2021

(54) ELECTRONIC DEVICE AND METHOD FOR ANTENNA SWITCHING

(71) Applicant: Quanta Computer Inc., Taoyuan (TW)

(72) Inventors: Chee-Chun Leung, Taoyuan (TW); Steve Cheng, Taoyuan (TW); Ming-Chuan Hu, Taoyuan (TW); Szu-Han Chiu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/034,839

(22) Filed: Sep. 28, 2020

(30) Foreign Application Priority Data

Jul. 29, 2020 (TW) .................................. 109125494

(51) Int. Cl.
| | |
|---|---|
| *H04L 5/12* | (2006.01) |
| *H04L 23/02* | (2006.01) |
| *H04B 7/06* | (2006.01) |
| *G01R 33/07* | (2006.01) |
| *H04B 17/318* | (2015.01) |
| *H04B 7/08* | (2006.01) |

(52) U.S. Cl.
CPC ............. *H04B 7/061* (2013.01); *G01R 33/07* (2013.01); *H04B 7/082* (2013.01); *H04B 17/318* (2015.01)

(58) Field of Classification Search
CPC ...... H04B 7/061; H04B 17/318; H04B 7/082; G01R 33/07

USPC ........................................................ 375/262
See application file for complete search history.

(56) References Cited

U.S. PATENT DOCUMENTS

| | | | |
|---|---|---|---|
| 9,867,139 B1* | 1/2018 | Khasgiwala | ........ H04W 52/367 |
| 2010/0117798 A1* | 5/2010 | Jenkins | .................... H04Q 9/00 340/10.1 |
| 2013/0038498 A1* | 2/2013 | Ferrer-Herrera | ... G06K 7/10356 343/788 |
| 2014/0342770 A1* | 11/2014 | Yang | .................... H04B 7/0808 455/552.1 |

* cited by examiner

*Primary Examiner* — Tanmay K Shah
(74) *Attorney, Agent, or Firm* — McClure, Qualey & Rodack, LLP

(57) ABSTRACT

An electronic device is able to be embedded in a mobile device with a plurality of antennas. The antennas are electrically coupled to the electronic device through a connector. The electronic device includes a plurality of built-in antennas, a communication processor, a plurality of antenna switching circuits, and a control processor. The built-in antennas receive a wireless mobile communication signal. The communication processor calculates the reception strength of the wireless signal received by each of the built-in antennas or each of the antennas. Each of the antenna switching circuits is electrically coupled to one of the built-in antennas or one of the antennas according to a control signal. The control processor correspondingly outputs the control signal according to the reception strength of the wireless signal received by the built-in antenna and the antenna.

10 Claims, 4 Drawing Sheets

ELECTRONIC DEVICE AND METHOD FOR ANTENNA SWITCHING

CROSS REFERENCE TO RELATED APPLICATIONS

This application claims priority to and the benefit of Taiwan Application No. 109125494, filed on Jul. 29, 2020, the entirety of which is incorporated by reference herein.

FIELD OF THE INVENTION

The invention relates in general to an electronic device, and in particular it relates to an electronic device and a method for antenna switching.

DESCRIPTION OF THE RELATED ART

In the past, a mobile network card that can be plugged into a laptop via USB may have included built-in antennas, or it may have been electrically coupled to antennas in the laptop (that is, the external antennas of the mobile network card) through a connector. As fifth-generation mobile communication technology New Radio (5G NR) requires high signal quality, when a mobile network card that supports 5G NR is embedded in a laptop, the fixed built-in antennas in the mobile network card may cause the reception strength of 5G NR to be poor. This is due to the occlusion of the user when using the laptop, and the occlusion of the mechanism of the laptop itself. As a result, the speed at which the user is able to upload and download files through the laptop is affected.

BRIEF SUMMARY OF THE INVENTION

In order to resolve the issues described above, an embodiment of the invention provides an electronic device which is able to be embedded in a mobile device with a plurality of antennas. The antennas are electrically coupled to the electronic device through a connector. The electronic device includes a plurality of built-in antennas, a communication processor, a plurality of antenna switching circuits, and a control processor. The built-in antennas receive a wireless signal of mobile communication. The communication processor calculates the reception strength of the wireless signal received by each of the built-in antennas or each of the antennas. Each of the antenna switching circuits is electrically coupled to one of the built-in antennas or one of the antennas according to a control signal. The control processor correspondingly outputs the control signal according to the reception strength of the wireless signal received by the built-in antenna or the antenna.

According to the electronic device disclosed above, further including a USB connector, and a Hall sensor. The control processor of the electronic device communicates with a processor if the mobile device through the USB connector. The Hall sensor detects the magnetic force of a magnet in the mobile device.

According to the electronic device disclosed above, the Hall sensor outputs an enable signal to the control processor according to the magnitude of the magnetic force. When the control processor receives the enable signal, the control processor determines that the electronic device has been installed in the mobile device.

According to the electronic device disclosed above, when the magnitude of the magnetic force detected by the Hall sensor is greater than a threshold, the Hall sensor outputs the enable signal to the control processor.

According to the electronic device disclosed above, when the reception strength of the wireless signal received by the built-in antenna is greater than that of the wireless signal received by the antenna, the control processor outputs the control signal so that each of the antenna switching circuits is electrically coupled to the built-in antenna.

According to the electronic device disclosed above, when the reception strength of the wireless signal received by the antenna is greater than that of the wireless signal received by the built-in antenna, the control processor outputs the control signal, so that each of the antenna switching circuits is electrically coupled to the antenna.

An embodiment of the invention also provides a method for antenna switching which is suitable for an electronic device with a plurality of built-in antennas. The electronic device is embedded in a mobile device with a plurality of antennas. The electronic device includes a plurality of antenna switching circuits. Each of the antenna switching circuits is electrically coupled to one of the built-in antennas or one of the antennas. The antennas are coupled to the electronic device through a connector. The method includes: outputting a first control signal to each of the antenna switching circuits, so that the built-in antennas receive a wireless signal for mobile communication; calculating the reception strength of the wireless signal received by each of the built-in antennas; outputting a second control signal to each of the antenna switching circuits, so that the antennas receive the wireless signal for mobile communication; calculating the reception strength of the wireless signal received by each of the antennas; and determining to output the first control signal or the second control signal to the antenna switching circuits according to the reception strength of the wireless signal received by both the built-in antenna and the antenna.

The method disclosed above further includes detecting the magnetic force of a magnet in the mobile device; outputting an enable signal according to the magnitude of the magnetic force; and determining whether the electronic device has been installed in the mobile device according to the enable signal.

BRIEF DESCRIPTION OF THE DRAWINGS

The invention can be more fully understood by reading the subsequent detailed description with references made to the accompanying figures. It should be understood that the figures are not drawn to scale in accordance with standard practice in the industry. In fact, it is allowed to arbitrarily enlarge or reduce the size of components for clear illustration.

DETAILED DESCRIPTION OF THE INVENTION

Figure 1:
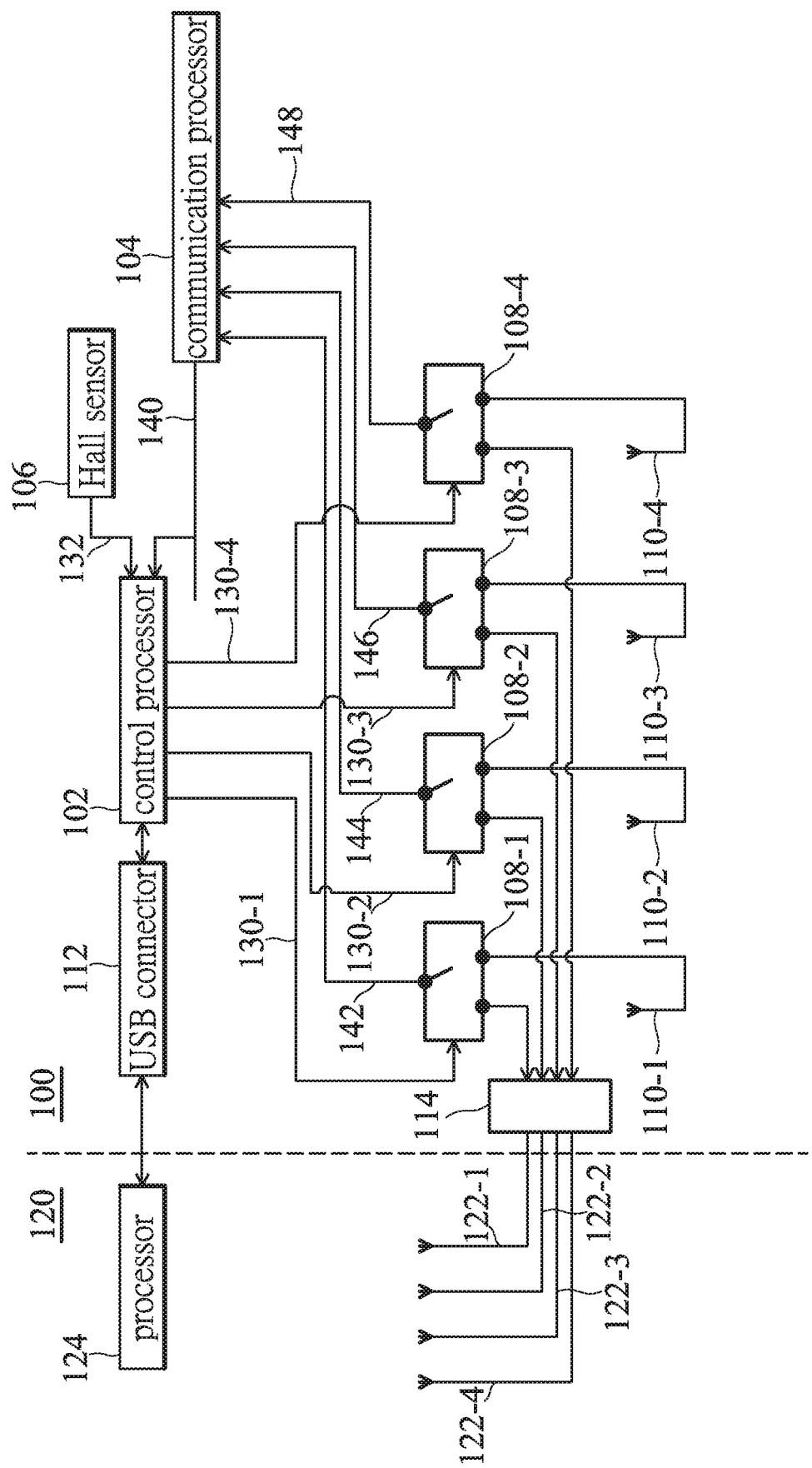
FIG. 1 is a block diagram of an electronic device in accordance with some embodiments of the disclosure.

FIG. 1 is a block diagram of an electronic device 100 in accordance with some embodiments of the disclosure. As shown in FIG. 1, the electronic device 100 includes a control processor 102, a communication processor 104, a Hall sensor 106, a plurality of antenna switching circuits (such as antenna switching circuits 108-1, 108-2, 108-3, 108-4), a plurality of built-in antennas (such as built-in antennas 110-1, 110-2, 110-3 and 110-4), a USB connector 112, and a connector 114.

In some embodiments, the electronic device 100 can be directly embedded or installed in a mobile device 120. The mobile device 120 includes a processor 124. The processor 124 communicates with the control processor 102 of the electronic device 100 through the USB connector 112. In some embodiments, the mobile device 120 may include another USB connector (not shown) to be connected to the USB connector 112 of the electronic device 100. Generally, the USB connector is a USB male plug, and the other USB connector of the mobile device 120 is a USB female socket.

In some embodiments, the mobile device 120 further includes a plurality of antennas (such as antennas 122-1, 122-2, 122-3 and 122-4). When the electronic device 100 is installed in the mobile device 120, the antennas 122-1, 122-2, 122-3 and 122-4 are electrically coupled to the electronic device 100 through the connector 114.

In some embodiments, the built-in antennas 110-1, 110-2, 110-3 and 110-4 of the electronic device 100 and the antennas 122-1, 122-2, 122-3, and 122-4 of the mobile device 120 can be any types of antennas, such as patch antennas, inverted F antennas (PIFA), loop antennas, monopole antennas, and dipole antennas . . . etc. In some embodiments, the mobile device 120 further includes another connector (not shown) to be connected to the connector 114 of the electronic device 100. In some embodiments, the connector 114 is a plurality of coaxial cables. In some embodiments, the mobile device 120 is a laptop or a tablet, but the present invention is not limited thereto.

The built-in antennas 110-1, 110-2, 110-3 and 110-4, and the antennas 122-1, 122-2, 122-3, and 122-4 are used to receive a wireless signal of mobile communication. In some embodiments, the mobile communication mentioned in the present invention refers to the fifth generation mobile communication technology (5G), and the wireless signal refers to the fifth generation mobile communication technology New Radio (5G NR), but the present invention is not limited thereto. In some embodiments, each of the antenna switching circuits 108-1, 108-2, 108-3 and 108-4 is a two-to-one switch. Each of the antenna switching circuits 108-1, 108-2, 108-3 and 108-4 has a control end, a first end, a second end, and a third end.

Each of the antenna switching circuits 108-1, 108-2, 108-3 and 108-4 receives the control signal from the control processor 102 through the control end. For example, the antenna switching circuit 108-1 receives a control signal 130-1 through its control end, the antenna switching circuit 108-2 receives a control signal 130-2 through its control end, the antenna switching circuit 108-3 receives a control signal 130-3 through its control end, and antenna switching circuit 108-4 receives a control signal 130-4 through its control end.

The first ends of the antenna switching circuits 108-1, 108-2, 108-3, and 108-4 are electrically coupled to the communication processor 104. For example, the first end of the antenna switching circuit 108-1 is coupled to the communication processor 104 through an RF line 142, the first end of the antenna switching circuit 108-2 is coupled to the communication processor 104 through an RF line 144, the first end of the antenna switching circuit 108-3 is coupled to the communication processor 104 through an RF line 146, and the first end of the antenna switching circuit 108-4 is coupled to the communication processor 104 through an RF line 148.

When the electronic device 100 is installed in the mobile device 120, the second ends of the antenna switching circuits 108-1, 108-2, 108-3, 108-4 are electrically coupled to the respective antennas 112-1, 122-2, 122-3, and 122-4 of the mobile device 120. The third ends of the antenna switching circuits 108-1, 108-2, 108-3, 108-4 are electrically coupled to the respective built-in antennas 110-1, 110-2, 110-3, and 110-4. It should be noted that although the number of built-in antennas in the electronic device 100, the number of antennas in the mobile device 120, and the number of antenna switching circuits in the electronic device 100 disclosed in FIG. 1 are all four, the present invention is not limited thereto.

The communication processor 104 receives the wireless signal from the built-in antenna 110-1 or the antenna 122-1 through the RF line 142, receives the wireless signal from the built-in antenna 110-2 or the antenna 122-2 through the RF line 144, receives the wireless signal from the built-in antenna 110-3 or the antenna 122-3 through the RF line 146, and receives the wireless signal from the built-in antenna 110-4 or the antenna 122-4 through the RF line 148. After that, the communication processor 104 calculates reception strengths of the wireless signal by each of the built-in antennas 110-1, 110-2, 110-3, 110-4 of the electronic device 100 or each of the antennas 122-1, 122-2, 122-3, 122-4 of the mobile device.

In some embodiments, the reception strength of the wireless signal described in the present invention is represented by a reference signal received power (RSRP). The communication processor 104 sends information of the reception strengths of all antennas (including the built-in antennas of the electronic device 100 and the antennas of the mobile device 120) to the control processor 102 through a communication line 140. In some embodiments, the communication processor 104 is a system-on-chip (SoC) supporting 5G NR.

Then, the control processor 102 compares the reception strength of the built-in antenna 110-1 and that of the antenna 122-1, compares the reception strength of the built-in antenna 110-2 and that of the antenna 122-2, compares the reception strength of the built-in antenna 110-3 and that of the antenna 122-3, and compares the reception strength of the built-in antenna 110-4 and that of the antenna 122-4. The control processor 102 outputs a control signal 130-1 to select the built-in antenna 110-1 and the antenna 122-1 which have the greater reception strength, outputs a control signal 130-2 to select the built-in antenna 110-2 and the antenna 122-2 which has the greater reception strength, outputs a control signal 130-3 to select the built-in antenna 110-3 and the antenna 122-3 which has the greater reception strength, and outputs a control signal 130-4 to select the built-in antenna 110-4 and the antenna 122-4 which has the greater reception strength.

For example, when the control processor 102 determines that the reception strength of the built-in antenna 110-1 is greater than that of the antenna 122-1, the reception strength of the built-in antenna 110-2 is less than that of the antenna 122-2, the reception strength of the built-in antenna 110-3 is greater than that of the antenna 122-3, and the reception strength of the built-in antenna 110-4 is less than that of the antenna 122-4, the control processor 102 outputs the control signal 130-1 with high voltage level (such as "1") to the antenna switching circuit 108-1, outputs the control signal 130-2 with low voltage level (such as "0") to the antenna switching circuit 108-2, outputs the control signal 130-3 with high voltage level to the antenna switching circuit 108-3, and outputs the control signal 130-4 with low voltage level to the antenna switching circuit 108-4.

In some embodiments, since the built-in antennas 110-1, 110-2, 110-3, and 110-4 of the electronic device 100 need to be operated in the form of MIMO, and the antennas 122-1, 122-2, 122-3, and 122-4 of the mobile device 120 also need to operate in the form of MIMO, in other words, the control processor 102 selects two of the built-in antennas 110-1, 110-2, 110-3, and 110-4, and selects two of the antennas 122-1, 122-2, 122-3, and 122-4 to receive the wireless signal of mobile communication. For example, the control processor 102 receives information of the reception strength of all antennas from the communication processor 104, and obtains the order of the reception strength in the electronic device 100, wherein the order from the best reception strength to the poor reception strength is the built-in antenna 110-2, the built-in 110-1, the built-in 110-3, and the built-in 110-4. The control processor 102 also obtains the order of the reception strength in the mobile device 120, wherein from the best reception strength to the poor reception strength is the antenna 122-1, the antenna 122-2, the antenna 122-3, and the antenna 122-4. In some embodiments, the communication processor 104 stores the information of the reception strengths of all antennas in a memory, so that the control processor 102 can read the information of the reception strengths of all antennas from the memory.

First, the control processor 102 selects the built-in antenna 110-2, the built-in antenna 110-1, the antenna 122-1, and the antenna 122-2 according to the reception strengths. However, because the built-in antenna 110-2 and the antenna 122-2 are switched through the same antenna switching circuit (the antenna switching circuit 108-2), the built-in antenna 110-1 and the antenna 122-1 are switched through the same antenna switching circuit (the antenna switching circuit 108-1), the control processor 102 compares the reception strengths of the built-in antenna 110-1 and the antenna 122-1, and compares the reception strengths of the built-in antenna 110-2 and the antenna 122-2.

For example, if the reception strength of the built-in antenna 110-1 is greater than that of the antenna 122-1, and the reception strength of the built-in antenna 110-2 is greater than that of the antenna 122-2, the control processor 102 selects the built-in antenna 110-1, the built-in antenna 110-2, the antenna 122-3, and the antenna 122-4 to receive the wireless signal of mobile communication. In the foregoing embodiments, combination of the antennas selected by the control processor 102 is only an example, and the present invention is not limited thereto. In some embodiments, the control processor 102 is a digital signal processor (DSP), but the present invention is not limited thereto.

The Hall sensor 106 detects the magnetic force of a magnet (not shown) in the mobile device 120. The Hall sensor 106 outputs an enable signal 132 (such as the enable signal 132 with high voltage level) to the control processer 102 according to the magnitude of the magnetic force. In some embodiments, when the Hall sensor 106 detects that the magnitude of the detected magnetic force is greater than a threshold, the Hall sensor 106 outputs the enable signal 132 to the control processor 102. When the control processor 102 receives the enable signal 132, the control processor 102 determines that the electronic device 100 has been installed in the mobile device 120.

Figure 2:
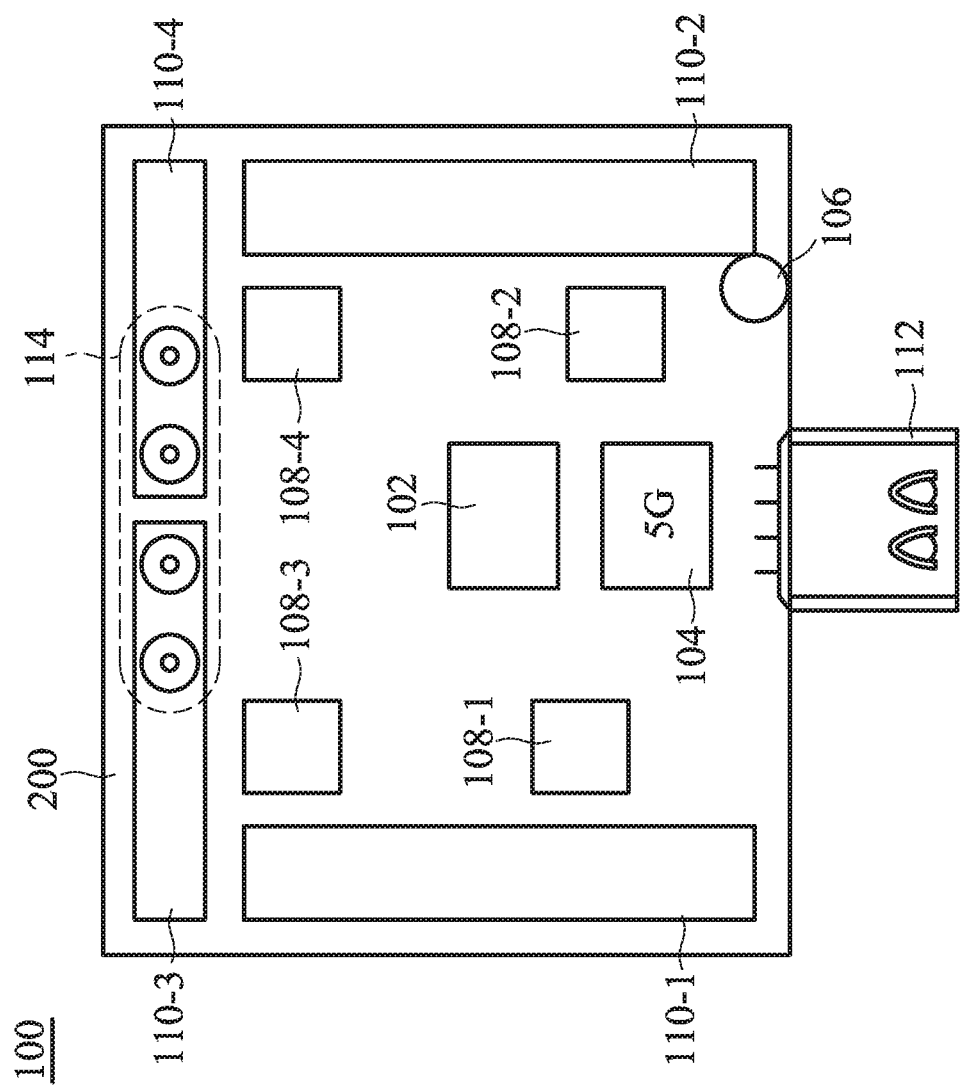
FIG. 2 is a layout diagram of the electronic device in accordance with some embodiments of the disclosure.

FIG. 2 is a layout diagram of the electronic device 100 in accordance with some embodiments of the disclosure. As shown in FIG. 2, the control processor 102, the communication processor 104, the Hall sensor 106, the antenna switching circuits 108-1, 108-2, 108-3 and 108-4m the built-in antennas 110-1, 110-2, 110-3 and 110-4, the USB connector 112, and the connector 114 are arranged on a substrate 200.

The built-in antennas 110-1, 110-2, 110-3 and 110-4, the USB connector 112, and the connector 114 are disposed on the edge of the substrate 200. The Hall sensor 106 is disposed adjacent to a corner of the built-in antenna 110-2. In some embodiments, when the electronic device 100 is installed in the mobile device 120, the vertical projection of the Hall sensor 106 overlaps with the magnet in the mobile device 120, so that the Hall sensor 106 directly senses the magnetic force of the magnet in the mobile device 120, and then the Hall sensor 106 sends the enable signal 132 to the control processor 102.

In some embodiments, the antenna switching circuits 108-1, 108-2, 108-3 and 108-4 are respectively disposed adjacent to the built-in antennas 110-1, 110-2, 110-3, and 110-4. The communication processor 104 is disposed in the middle part of the substrate 200 to facilitate the collection of wireless signals from the antenna switching circuits 108-1, 108-2, 108-3, and 108-4 (for example, through the RF lines 142, 144, 146, and 148 in FIG. 1). The control processor 102 is disposed in the middle part of the substrate 200 to facilitate to respectively the control signals (for example, the control signals 130-1, 130-2, 130-3, and 130-4) to the antenna switching circuits 108-1, 108-2, 108-3, and 108-4.

Figure 3:
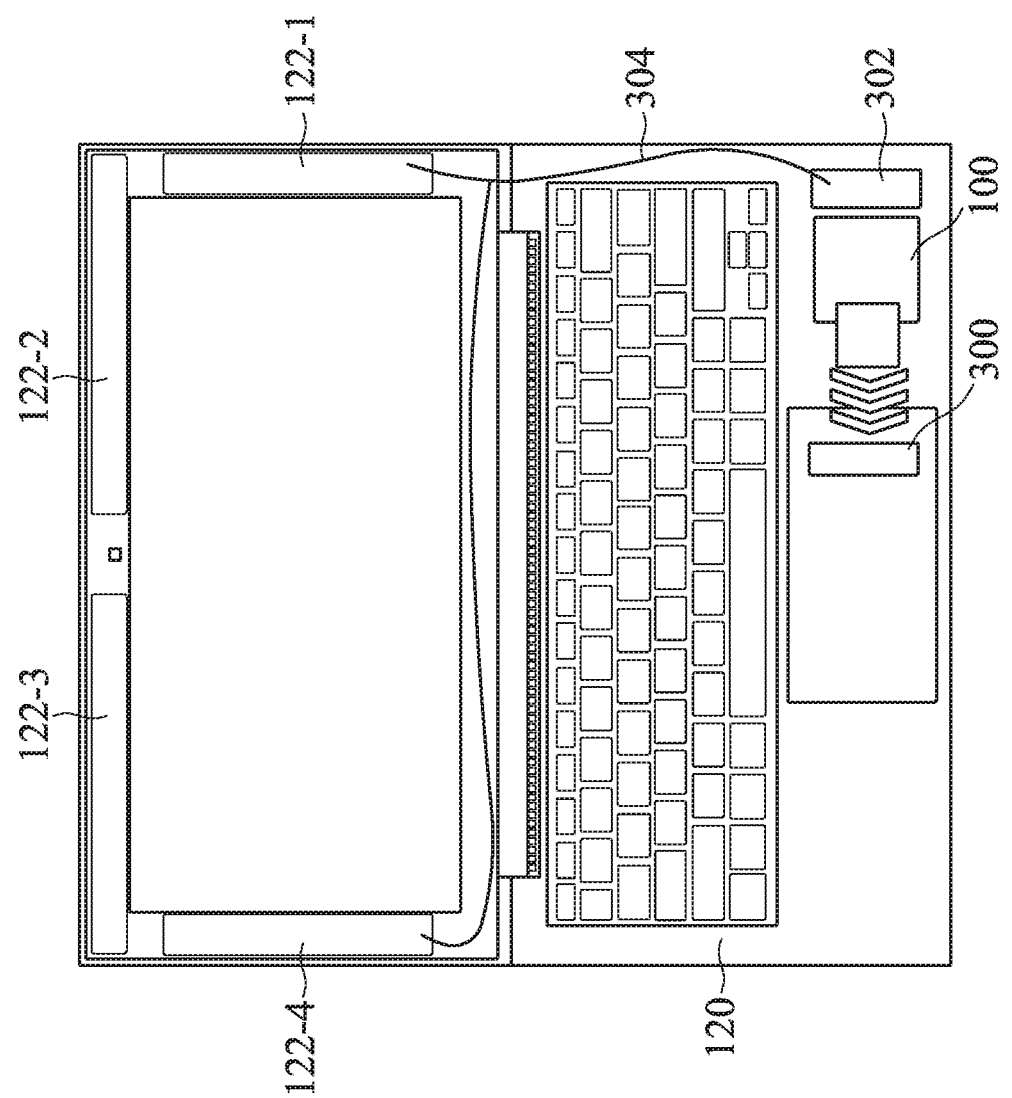
FIG. 3 is a schematic diagram of installing the electronic device in a mobile device in accordance with some embodiments of the disclosure.

FIG. 3 is a schematic diagram of installing the electronic device 100 in the mobile device 120 in accordance with some embodiments of the disclosure. As shown in FIG. 3, the mobile device 120 includes the antennas 122-1, 122-2, 122-3, and 122-4, a USB connector 300, and a connector 302. In some embodiments, the antennas 122-1, 122-2, 122-3, and 122-4 are disposed beside the display of the mobile device 120, and surround the display of the mobile device 120. The USB connector 300 and the connector 302 are disposed adjacent to the keyboard area of the mobile device 120.

Refer to FIGS. 1 and 3 at the same time, in some embodiments, when the electronic device 100 is installed in the mobile device 120, the USB connector 300 is coupled to the USB connector 112 of the electronic device 100, and the connector 302 is coupled to the connector 114 of the electronic device 100. Although FIG. 3 only shows that a line 304 is electrically coupled to the antennas 122-1 and 122-4, the connector 302 is actually electrically coupled to the antennas 122-1, 122-2, 122-3, and 122-4 through the line 304.

Figure 4:
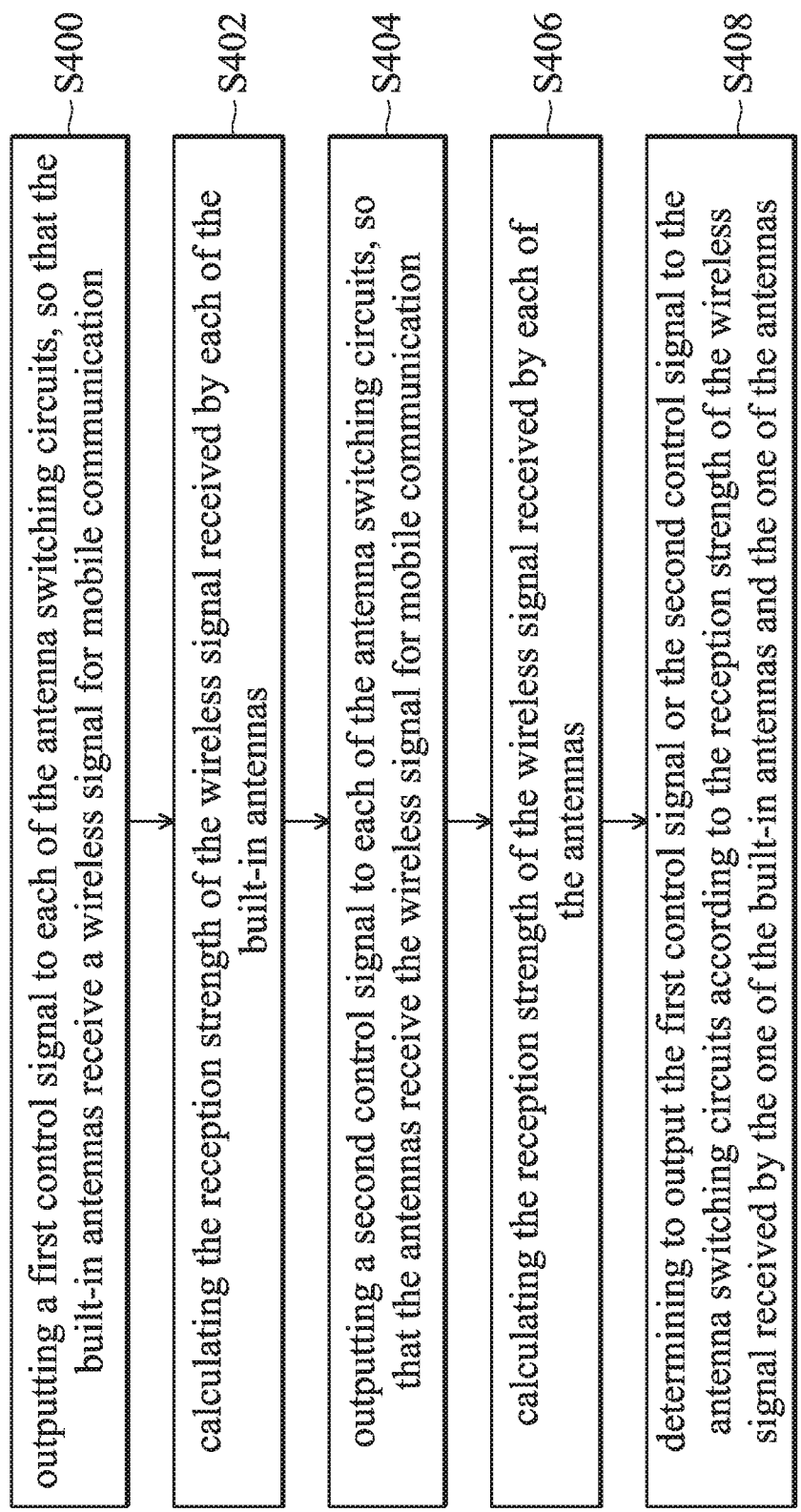
FIG. 4 is a flow chart of a method for antenna switching in accordance with some embodiments of the disclosure.

FIG. 4 is a flow chart of a method for antenna switching in accordance with some embodiments of the disclosure. Refer to FIGS. 1 and 4 at the same time, the method for antenna switching method is suitable for an electronic device (such as the electronic device 100) with a plurality of built-in antennas (such as the built-in antennas 110-1, 110-2, 110-3 and 110-4). The electronic device 100 is embedded in a mobile device (such as the mobile device 120) with a plurality of antenna switching circuits (such as the antenna switching circuits 108-1, 108-2, 108-3, and 108-4). Each of the antenna switching circuits is electrically coupled to one of the built-in antennas or one of the antennas (for example, the antenna switching circuit 108-1 is electrically coupled to the built-in antenna 110-1 or the antenna 122-1). The antennas 122-1, 122-2, 122-3, and 122-4 of the mobile device 120 are electrically coupled to the electronic device 100 through a connector (such as the connector 114).

As shown in FIG. 4, the method for antenna switching of the present invention includes outputting a first control signal to each of the antenna switching circuits, so that the built-in antennas receive a wireless signal for mobile communication (step S400); calculating the reception strength of the wireless signal received by each of the built-in antennas (step S402); outputting a second control signal to each of the antenna switching circuits, so that the antennas receive the wireless signal for mobile communication (step S404); calculating the reception strength of the wireless signal received by each of the built-in antennas (step S406); and determining to output the first control signal or the second control signal to the antenna switching circuits according to the reception strength of the wireless signal received by both the built-in antenna and the antenna (step S408).

The first control signal in steps S400 and S408 may be, for example, the control signals 130-1, 130-2, 130-3, or 130-4 with high voltage level. The second control signal in steps S404 and S408 may be the control signals 130-1, 130-2, 130-3, or 130-4 with low voltage level. In some embodiments, steps S400, S404, and S408 are executed by the control processor 102 in FIG. 1. Steps S402 and S406 are executed by the communication processor 104 in FIG. 1.

In some embodiments, the method for antenna switching further includes: detecting the magnetic force of a magnet in the mobile device (step S500, not shown); outputting an enable signal (such as the enable signal 132) according to the magnitude of the magnetic force (step S502, not shown); and determining whether the electronic device has been installed in the mobile device according to the enable signal (step S504, not shown). In some embodiments, the steps S500 and S502 are executes by the Hall sensor 106 in FIG. 1. Step S504 is executed by the control processor 102 in FIG. 1. The electronic device 100 and the method (steps S400-S408) for antenna switching of the present invention can achieve the technical effect of "automatically switching the built-in antenna or the external antenna according to the reception strength of the wireless signal received by the antenna".

The ordinals in the specification and the claims of the present invention, such as "first", "second", "third", etc., have no sequential relationship, and are just for distinguishing between two different components with the same name. In the specification of the present invention, the word "couple" refers to any kind of direct or indirect electronic connection. The present invention is disclosed in the preferred embodiments as described above, however, the breadth and scope of the present invention should not be limited by any of the embodiments described above. Persons skilled in the art can make small changes and retouches without departing from the spirit and scope of the invention. The scope of the invention should be defined in accordance with the following claims and their equivalents.

What is claimed is:

1. An electronic device, comprising:
    a plurality of built-in antennas, receiving a wireless signal of mobile communication;
    a communication processor, calculating the reception strength of the wireless signal received by each of the built-in antennas or each of antennas of a mobile device;
    a plurality of antenna switching circuits; wherein each of the antenna switching circuits is electrically coupled to one of the built-in antennas or one of the antennas of the mobile device according to a control signal;
    a control processor, correspondingly outputting the control signal according to the reception strength of the wireless signal received by the one of the built-in antennas or the one of the antennas of the mobile device;
    wherein the electronic device is able to be embedded in the mobile device, and is electrically coupled to the antennas of the mobile device through a connector.

2. The electronic device as claimed in claim 1, further comprising:
    a USB connector; wherein the control processor of the electronic device communicates with a processor of the mobile device through the USB connector.

3. The electronic device as claimed in claim 1, further comprising:
    a Hall sensor, detecting the magnetic force of a magnet in the mobile device.

4. The electronic device as claimed in claim 3, wherein the Hall sensor outputs an enable signal to the control processor according to the magnitude of the magnetic force.

5. The electronic device as claimed in claim 4, wherein when the control processor receives the enable signal, the control processor determines that the electronic device has been installed in the mobile device.

6. The electronic device as claimed in claim 4, wherein when the magnitude of the magnetic force detected by the Hall sensor is greater than a threshold, the Hall sensor outputs the enable signal to the control processor.

7. The electronic device as claimed in claim 1, wherein when the reception strength of the wireless signal received by the one of the built-in antennas is greater than that of the wireless signal received by the one of the antennas, the control processor outputs the control signal, so that each of the antenna switching circuits is electrically coupled to the one of the built-in antennas.

8. The electronic device as claimed in claim 1, wherein when the reception strength of the wireless signal received by the one of the antennas is greater than that of the wireless signal received by the one of the built-in antennas, the control processor outputs the control signal, so that each of the antenna switching circuits is electrically coupled to the one of the antennas.

9. A method for antenna switching, suitable for an electronic device with a plurality of built-in antennas; wherein the electronic device comprises a plurality of antenna switching circuits, each of the antenna switching circuits is electrically coupled to one of the built-in antennas or one of antennas of a mobile device; the method comprising:
    embedding the electronic device into the mobile device; wherein the electronic device is electrically coupled to the antennas of the mobile device through a connector;
    outputting a first control signal to each of the antenna switching circuits, so that the built-in antennas receive a wireless signal for mobile communication;
    calculating the reception strength of the wireless signal received by each of the built-in antennas;
    outputting a second control signal to each of the antenna switching circuits, so that the antennas of the mobile device receive the wireless signal for mobile communication;
    calculating the reception strength of the wireless signal received by each of the antennas of the mobile device;
    determining to output the first control signal or the second control signal to the antenna switching circuits according to the reception strength of the wireless signal received by the one of the built-in antennas and the one of the antennas of the mobile device.

10. The method as claimed in claim 9, further comprising:
    detecting the magnetic force of a magnet in the mobile device;
    outputting an enable signal according to the magnitude of the magnetic force;

determining whether the electronic device has been installed in the mobile device according to the enable signal.

\* \* \* \* \*